United States Patent [19]

Dickinson

[11] 3,896,431

[45] July 22, 1975

[54] ANALOGUE-TO-DIGITAL CONVERTERS

[75] Inventor: Brian Arthur Leonard Dickinson, Cambridge, England

[73] Assignee: Pye Limited, Cambridge, England

[22] Filed: Nov. 15, 1973

[21] Appl. No.: 416,038

[30] Foreign Application Priority Data

Nov. 29, 1972 United Kingdom ............... 55139/72

[52] U.S. Cl. ..................... 340/347 NT; 340/347 AD

[51] Int. Cl. ............................................ H03k 13/20

[58] Field of Search ................ 340/347 AD, 347 NT

[56] References Cited

UNITED STATES PATENTS

| | | | |
|---|---|---|---|
| 3,349,390 | 10/1967 | Glassman | 340/347 |
| 3,480,948 | 11/1969 | Lord | 340/347 |
| 3,686,665 | 8/1972 | Elias et al. | 340/347 AD |
| 3,793,630 | 2/1974 | Meijer | 340/347 NT |

OTHER PUBLICATIONS

Nonlinear Dual Integrating Ramp ADC T. J. Harrison IBM Technical Disclosure Bulletin p. 623 Vol. 11 No. 6 1968.

*Primary Examiner*—Malcolm A. Morrison
*Assistant Examiner*—Vincent J. Sunderdick
*Attorney, Agent, or Firm*—Frank R. Trifari

[57] ABSTRACT

An analogue-to-digital converter of the dual slope integration type has an integrator portion and analogue input signal of one polarity and a reference signal of opposite polarity, the two signals being alternately connected to the integrator portion. The invention includes means for generating a variable reference signal, the magnitude of which is varied in dependence on the magnitude of the analogue input signal, for producing a predetermined non-linear relationship between the analogue input and the digital output of the converter.

5 Claims, 5 Drawing Figures

PATENTED JUL 22 1975

3,896,431

SHEET 2

ANALOGUE-TO-DIGITAL CONVERTERS

BACKGROUND OF THE INVENTION

This invention relates to analogue-to-digital converters of the dual-slope integration type. It has particular but not exclusive application where it is required to convert to digital form an analogue signal derived from a transducer which has a non-linear relationship between its input and its analogue output.

In analogue-to-digital converters of the dual-slope integration type, an input voltage $V_i$ to be digitised is switched to the input of an integrator for a fixed period of time $t_1$. If the integrator time constant is RC and the integrator output voltage V starts at zero, then after a time $t_1$, $$V = \frac{V_i t_1}{RC}$$

At the end of time $t_1$ the integrator is disconnected from $V_i$ and connected to a stable reference potential $V_R$ of opposite polarity to $V_i$. The integrator output voltage now reduces linearly towards zero and reaches the original value (zero) after a time interval $t_2$ given by:

$$t_2 = \frac{V\,RC}{V_R}$$

$$\therefore t_2 = \frac{V_i t_1}{RC} \times \frac{RC}{V_R} = \frac{t_1 V_i}{V_R}$$

Since $t_1$ and $V_R$ are both constant, $t_2 \propto V_i$.

A clock pulse generator provides a train of pulses of constant frequency. The number of clock pulses occurring during the time interval $t_2$ is counted to provide a digital output signal corresponding to the analogue input $V_i$. It should be noted that the analogue input/-digital output characteristic is linear. Such converters are therefore suitable for use when a digital signal corresponding to an electrical quantity is required, as for example in digital voltmeters and current meters.

When a signal corresponding to a non-electrical quantity such as temperature or pressure is required, a transducer is employed to produce an electrical analogue of the quantity. Frequently the input/output characteristic of the transducer is non-linear. If the analogue output of the transducer is applied to a converter of the type outlined above, the overall input quantity/digital output characteristic will also be non-linear. For example a digital temperature indicator may comprise a thermocouple feeding a digital voltmeter. The temperature/e.m.f. characteristic of thermocouples are in general non-linear, hence the digital output will not be directly proportional to temperature.

SUMMARY OF THE INVENTION

It is an object of the present invention to provide an analogue-to-digital converter having an input/output characteristic capable of being adjusted in conformity with the non-linear input/output characteristic of an analogue signal source such as a transducer so as to produce a substantially linear overall characteristic relating transducer input and digital output.

According to the invention, there is provided an analogue-to-digital converter of the dual slop integration type in which an analogue input signal of one polarity and a reference signal of opposite polarity are alternately connected to an integrator circuit, including reference signal generating means whereby the magnitude of the reference signal is varied in dependence on the magnitude of the analogue signal so as to produce a predetermined non-linear relationship between the analogue input and the digital output of the converter.

The reference signal generating means may comprise means for deriving a first signal from the analogue signal such that the ratio of the magnitude of the first signal to the magnitude of the analogue signal bears one of a plurality of fixed numerical values, the one value being selected in dependence on the magnitude of the analogue signal, and means for summing the first signal with a second signal of constant magnitude to provide the said reference signal.

The means for deriving the first signal may comprise a potential dividing network including a plurality of resistors each in series with a respective one of a corresponding plurality of switches, each of the switches being adapted to connect its corresponding resistor to the network so as to modify the dividing ratio of the latter when the output from the network attains a predetermined level uniquely associated with the said switch.

Means may be provided for controlling the polarity of the reference signal in dependence upon the polarity of the analogue input signal.

BRIEF DESCRIPTION OF THE DRAWINGS

In order that the invention may be more clearly understood, an embodiment thereof will now be described by way of example, with reference to the attached drawings of which.

DESCRIPTION OF THE PREFERRED EMBODIMENTS

Figure 1:
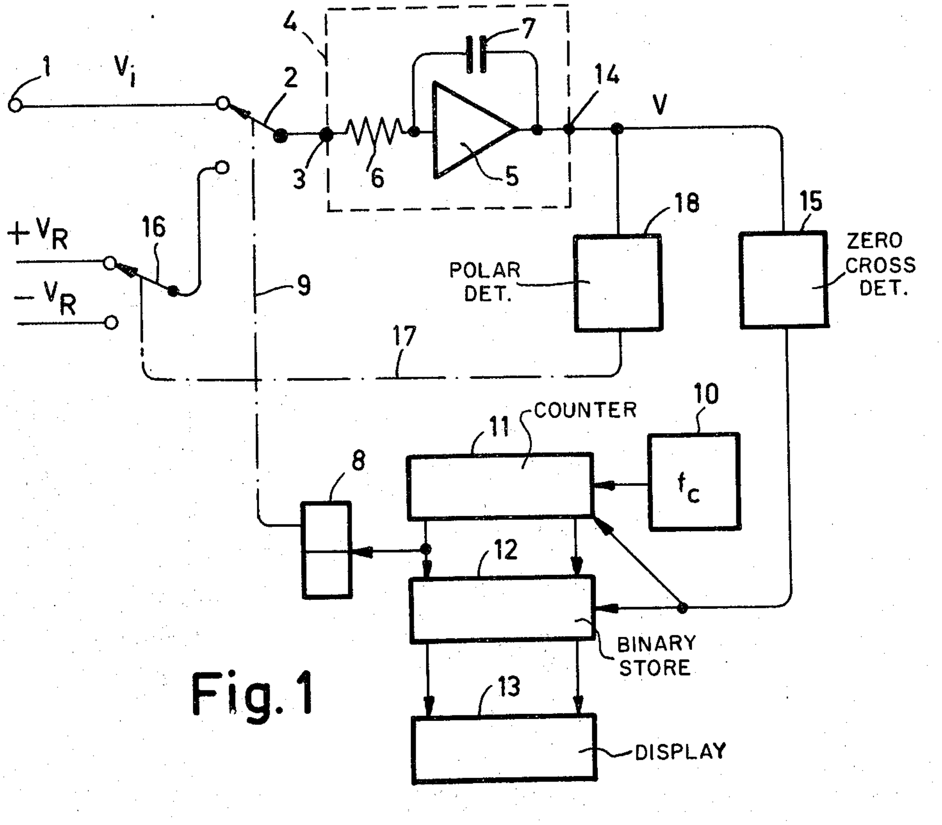
FIG. 1 is a block schematic diagram of a known form of analogue-to-digital conveter.

The essential elements of a known form of digital voltmeter employing the dual slope integration method will first be described with reference to FIG. 1.

An input voltage $V_i$ to be digitised is applied via an input terminal 1 to a first fixed contact of a changeover switch 2. The movable contact of the switch 2 is connected to an input terminal 3 of an integrator circuit shown within the broken rectangle 4 and comprising an operational amplifier 5, an input resistor 6 of value R connected between the terminal 3 and the input of the amplifier 5 and a feedback capacitor 7 of value C connected between the output and the input of the amplifier 5.

A constant reference potential of magnitude $V_R$ greater than the maximum value of $V_i$ is provided by a reference voltage source not shown in FIG. 1, and is connected via a switch 16 which will be further described hereinafter to a second fixed contact of the switch 2. The switch 2 is controlled by a bistable trigger circuit 8 as indicated by the broken line 9 so as to connect $V_i$ to the integrator input terminal 3 when the bistable is in its first stable state, and to connect $V_R$ to terminal 3 when the bistable is in its second stable state. It is to be understood that the switch 2 may preferably comprise a solid state switching circuit rather than the mechanical switch which has been shown in FIG. 1 for greater clarity.

A clock pulse generator 10 feeds a train of pulses of constant frequency $f_c$ to the input of a recycling binary counter 11 arranged to produce an output pulse for every N clock pulses and immediately reset itself to zero count. The output of the counter 11 is connected to the trigger input of the bistable 8.

A binary store 12 has its individual stage inputs connected to the corresponding stages of the counter 11 so that it continuously records the count state of the latter. The outputs of the store 12 are connected to the inputs of a decode and display unit 13.

The output terminal 14 of the integrator 4 is connected to the input of a zero crossing detector circuit 15 which is adapted to produce a pulse at its output each time the signal applied to its input passes through zero. The output of the unit 15 is connected to a transfer input of the store 12, and also to a count reset input of counter 11 such that a pulse from detector 15 causes the current count state of counter 11, as recorded, in store 12 to be transferred to the decode and display unit 13 and also causes counter 11 to be reset to the zero count state.

Figure 2:
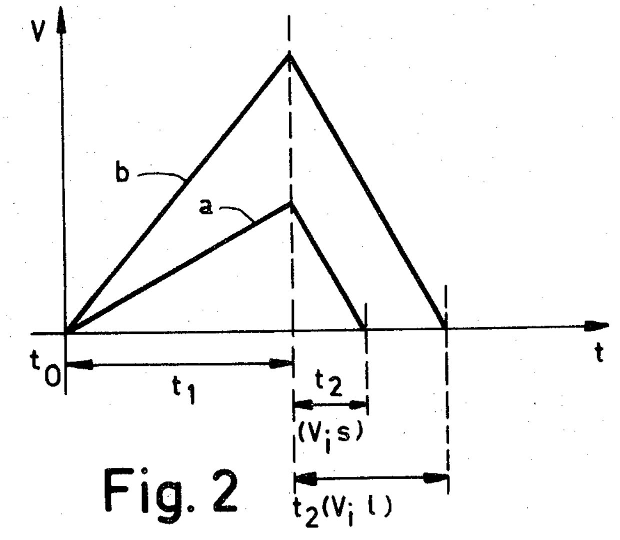
FIG. 2 illustrates the variation of the integrator output potential in the arrangement of FIG. 1.

The operation of the circuit of FIG. 1 will not be described with additional reference to FIG. 2, which shows the integrator output voltage with respect to time for a small (curve *a*) and a large (curve *b*) value of input voltage $V_i$.

Assume that at a time $t_o$ a cycle of the counter 11 is just commencing, i.e. the instantaneous value of the count is zero, and that the counter output pulse has reset the bistable 8 to its first stable state. The switch 2 is therefore set to connect the input voltage $V_i$ to the integrator input terminal 3. As will become apparent, at time $t_o$ the instantaneous value of the integrator output voltage $V$ is zero.

$V$ then rises linearly, as shown by FIG. 2 at a rate determined by the magnitude of $V_i$, and continues to rise until after a time interval $t_1$, counter 11 reaches its maximum count state and the resulting pulse sets the bistable 8 to its second stable state. This has the effect of disconnecting $V_i$ from the integrator input terminal 3 and connecting $V_R$ to terminal 3. The time interval $t_1$ is determined by the capacity N of the counter 11 and the frequency $f_c$ of the clock pulse generator 10 in accordance with the relationship $t_1 = N/f_c$.

Since $V_R$ is of opposite polarity to $V_i$, the output voltage $V$ now commences to fall linearly at a rate determined by the magnitude of $V_R$, reaching its original value (zero) after a further time interval $t_2$. As shown hereinbefore, $t_2 \propto V_i$.

When the integrator output voltage reaches zero, an output pulse is produced by the zero crossing detector 15 and is applied to the transfer input of the store 12. At the commencement of the time interval $t_2$ the instantaneous value of the count in the counter 11 is zero. During $t_2$, clock pulses are counted and the count is registered in the store 12. The effect of the output pulse from unit 15 is to transfer the binary number $n$ of clock pulses occurring during the interval $t_2$ to the decode and display unit 13. Since $t_2 = n/f_c$, $n$ is proportional to $V_i$.

In unit 13, the binary number $n$ is decoded into decimal notation and used to drive a numerical display giving a direct read-out of the magnitude of the input signal $V_i$.

A further effect of the pulse from the zero crossing detector 15 is to reset the counter 11 to zero. The counter therefore gives an output pulse which resets the bistable 8, reconnecting the input voltage $V_i$ to the integrator input terminal, and a further measurement cycle begins, at the end of which the decode and display unit 13 is updated.

In FIG. 2, the integrator output voltage $V$ is shown as increasing from zero to a positive value during the interval $t_1$ and falling again to zero during $t_2$. Since the output of the integrator 4 is inverted with respect to its input, this requires that $V_i$ is of negative polarity and $V_R$ is of positive polarity. It is apparent that if $V_i$ were positive and $V_R$ negative, $V$ would fall from zero to a negative value during $t_1$ and rise again to zero during $t_2$, the operation of the circuit being otherwise as hereinbefore described.

In order that the integrator may respond to input signals of either polarity there may be provided two reference voltages $V_R$ and $-V_R$ of equal magnitude and opposite polarity connected respectively to first and second fixed contacts of changeover switch 16 whose movable contact is connected to the second fixed contact of the switch 2. Preferably the switch 16 comprises a solid state switching circuit rather than the mechanical which is the switch shown in FIG. 1 for the purposes of clarity. Switch 16 is controlled, as indicated by the broken line 17, by the output of a polarity detection circuit 18 whose input is connected to the output terminal 14 of the integrator 4. If the integrator output potential goes positive during $t_1$, the polarity detector 18 provides an output signal which causes the switch 16 to select the negative reference potential $-V_R$. Conversely if $V$ goes negative then $+V_R$ is selected. The polarity detector 18 may also drive a visual dsplay (not shown) to indicate the polarity of the input signal $V_i$.

In the analogue-to-digital converter described with reference to FIG. 1, the value of the numerical output displayed by unit 13 is linearly related to the magnitude of the input signal $V_i$.

There will now be described an arrangement according to the present invention, with reference to FIGS. 3 and 4. Circuit elements whose nature and function have already been described have been given identical reference to those employed in FIG. 1 and are not further described hereinbelow.

Figures 3, 5:
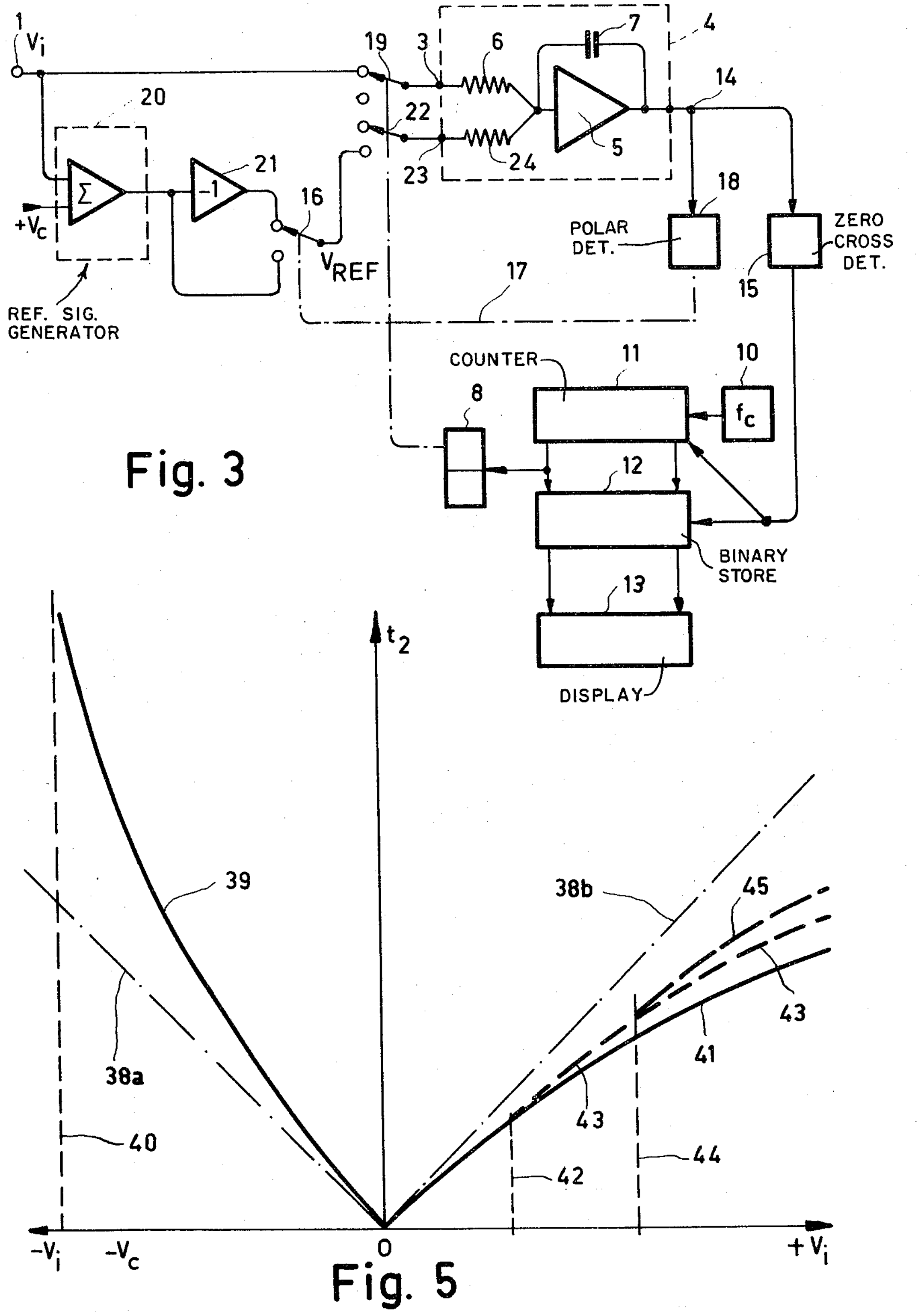
FIG. 3 is a block schematic diagram of an analogue to digital converter according to the invention.
FIG. 5 is a characteristic curve used to illustrate the mode of operation of the embodiment of FIG. 3.

Referring to FIG. 3, the analogue input terminal 1 is connected to the input terminal 3 of the integrator 4 via a switch 19 and is further connected to an input of a reference signal generator unit shown generally by the broken rectangle 20. Unit 20 will be more particularly described hereinafter with reference to FIG. 4. A signal of constant positive potential $+V_C$ is also supplied to unit 20 from a stable source not shown in FIGS. 3 and 4.

The output of unit 20 is connected to the input of an inverting amplifier 21 having a gain of $-1$, and also to the second fixed contact of the switch 16. The output of the amplifier 21 is connected to the first fixed contact of the switch 16 whose movable contact is connected, via a switch 22 to an input terminal 23 of the integrator 4. Within the integrator 4, the terminal 23 is connected to the input of the amplifier 5 by way of an input resistor 24.

The switches 19 and 22 are both controlled by the bistable circuit 8 in such a way that when the switch 19 is closed the swtich 22 is open and vice versa. Preferably solid state switching devices are employed for the switches 19 and 22.

Figure 4:
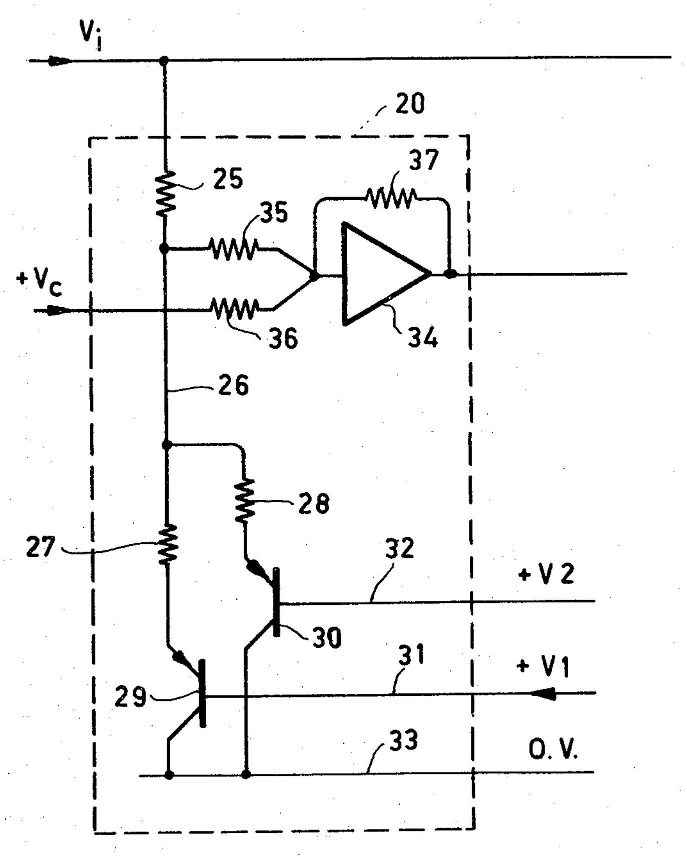
FIG. 4 is a more detailed schematic diagram of a reference signal generator used in the embodiment of FIG. 3.

Referring now to FIG. 4, in the reference signal generator unit 20, the analogue input signal is connected to one end of a resistor 25 whose other end is connected to a connection line 26. Resistors 27 and 28 each have one end connected to the line 26, and their other ends connected to the emitter electrodes of respective P.N.P. transistors 29 and 30. The base electrode of the transistor 29 is connected to a line 31 carrying a constant potential $+V_1$ from a stabilised source not shown in the drawing. The base of the transistor 30 is similarly connected to a line 32 carrying a constant potential $+V_2$. The collector electrodes of the transistors 29 and 30 are connected together and to a line 33 carrying zero potential.

The line 26 is connected to an input of an operational amplifier 34 via an input resistor 35. The constant potential $+V_c$ is connected to the said input via an input resistor 36. A feedback resistor 37 is connected between the output and the input of the amplifier 34.

In the arrangement shown, for all negative values of $V_i$, the transistors 29 and 30 are cut off and no current flows in the resistors 27 and 28. If the resistors 36 and 37 are equal in value the output voltage $V_{REF}$ produced by the amplifier 34 is equal to the algebraic sum of $V_c$ and $(V_i \times k)$ where $k$ is the resistance ratio of the sum of the resistors 25 and 35 to the resistor 37. The same holds true for small positive values of $V_i$ such that the potential on the line 26 is less than $+V_1$. For greater positive values of $V_i$, the transistor 29 conducts. The resistors 25 and 27 now form a potential divider for the analogue input $V_i$. The effect is to reduce the value of $k$. For still higher positive values of $V_i$ the transistor 30 also conducts, connecting the resistor 28 in parallel with the resistor 27 and thereby further reducing the value of $k$.

The operation of the arrangement described with reference to FIGS. 3 and 4 will now be described.

Assume that in the integrator 4 the resistor 24 is equal in value to the resistor 6. The arrangement comprising the switches 19 and 22 and the resistors 6 and 24 shown in FIG. 3 is then electrically equivalent to that shown in FIG. 1 and comprising the switch 2 and the resistor 6.

The analogue input $V_i$ is connected to the input of the integrator 4 for a time interval $t_1$ determined by the counter 11 precisely as hereinbefore described with reference to FIG. 1. During the time interval $t_1$ the polarity detector 18 sets the switch 16 to select either the output $-V_{REF}$ from the reference signal generator 20 or the output $+V_{REF}$ from the inverting amplifier 21 accordingly as the potential $V$ at the output of the integrator has positive or negative polarity. At the end of the time interval $t_1$ the switches 19 and 22 are reversed, so diconnecting the input voltage $V_i$ from, and connecting the selected reference potential to, the integrator input. The integrator output then runs back towards zero for a time interval $t_2$ which is terminated by an output pulse from the zero crossing detector 15.

The manner in which the time interval $t_2$ varies with the value and polarity of the input voltage $V_i$ will be described with reference to FIG. 5, in which values of $V_i$ are plotted as abscissae and those of $t_2$ as ordinates.

Assume initially that $k$ is very small. The contribution of $V_i$ to the reference signal $V_{REF}$ will then be negligible, and $t_2$ will vary substantially linearly with $V_i$ as shown for negative inputs by the chain dotted line 38*a*, and for positive inputs by the line 38*b*.

Now assume that, for values of $V_i$ such that the transistors 29 and 30 are cut off, the value of $k$ is unity, i.e. that the sum of the values of the resistors 25 and 35 are equal to the value of the resistor 36 (and that of the resistor 37). For small values of $V_i$, its contribution to the reference voltage $V_{REF}$ is likewise small and $V_{REF}$ is substantially equal to $\mp V_c$ according as $V_i$ is negative or positive. As $V_i$ becomes increasingly more negative, the value of $V_{REF}$ progressively decreases, until a point is reached at which $V_i$ has equal magnitude with $V_c$ but is of opposite polarity when $V_{REF}$ equals zero. For this condition the integrator output voltage $V$ remains constant during $t_2$, and $t_2$ therefore becomes infinite. For negative inputs the relationship between $V_i$ and $t_2$ follows a curve such as 39, tangential to curve 38*a* at $V_i = 0$ and approaching asympotically the broken line 40 corresponding to $V_i = -V_c$.

For increasing positive values of $V_i$ the value of $V_{REF}$ is progressively increased. Hence $t_2$ becomes progressively less, by comparison with the $k=0$ case. In the absence of the transistors 29 and 30 and the corresponding resistors 27 and 28, the value of $k$ would remain unity for all positive values of $V_i$, and the relationship between $t_2$ and $V_i$ would follow a smooth curve such as 41. In practice however, when $V_i$ reaches a value indicated in FIG. 5 by the broken line 42, the transistor 29 commences to conduct, thereby reducing the value of $k$, so that for higher values of $V_i$ the relationship follows a curve such as 43 up to a point indicated by the line 44 where the transistor 30 also conducts. This further reduces the value of $k$, and thereafter the relationship follows a curve such as 45.

It will be apparent that if the initial value of $k$ is less than unity, then the curve 39 will approach inifinity for a value of $V_i$ correspondingly more negative than $-V_c$, i.e. it will approach more closely to the linear relationsip shown by the curve 38*a*. Similarly, for positive values of $V_i$ the combined curve 41-43-45 will approach more closely the curve 38*b*. If $k$ is initially greater than unity, the departures from linearity will be correspondingly greater than those shown in FIG. 5.

In the reference signal generator 20 there may be provided further series combinations each comprising a transistor and a resistor connected between the junction 26 and the zero potential line 33, each of the additional transistors being arranged to conduct when the potential on the junction 26 reaches a predetermined level so as to provide additional points at which the value of $k$ is modified. One or more of such additional transistors may be arranged to conduct when the potential on the line 26 exceeds a predetermined negative potential. Furthermore, the constant input $V_c$ may be arranged to have a negative instead of a positive potential. In this last case, the operation will be as described with reference to FIGS. 4 and 5 but with reversed polarities of the input signals.

Thus, in an analogue to digital converter according to the present invention the relationship between this analogue input signal and the digital output corresponding to the time interval $t_2$ may be adjusted so as to approach a desired non-linear characteristic within close limits. In particular it may be made to approach the characteristic necessary to provide compensation for the non-linear input/output characteristic of a transducer whose output is to be digitised so that the digital output signal is substantially directly proportional to the input to the transducer. The transducer may be a thermocouple and the equipment may provide a digital read-out of temperature.

In the known arrangement described with reference to FIG. 1, the reference signal supplied to the integrator input is always of greater magnitude than the analogue signal, and consequently the time interval $t_2$ is always less than the time interval $t_1$. Hence the number of clock pulses occurring during $t_2$ is always less than the capacity of the counter 11.

In arrangements according to the present invention there is a range of values of $V_i$ for which the magnitude of the reference signal $V_{REF}$ *is less than that of* $V_i$. In the absence of suitable provision, this would result in the time interval $t_2$ being greater than $t_1$ and consequently in the counter 11 being overfilled.

For this reason the reference signal $V_{REF}$ is supplied via the switch 22 to the integrator input terminal 23, whence it is fed to the input of the amplifier 5 via the input resistor 24, while the analogue signal $V_i$ is fed via terminal 3 and input resistor 6. The integration time constant is CR for the analogue signal and $CR_1$ for the reference signal where C, R and $R_1$ represent the values of the capacitor 7 and the resistors 6 and 24 respectively. By making $R_1$ less than R, it can be arranged that for all values of $V_i$ within the working range the integrator output voltage returns to zero in a time interval $t_2$ less than $t_1$.

What we claim is:

1. In an analogue-to-digital converter of the dual slope integration type having an integrator portion, an analog input signal of one polarity, a reference signal of opposite polarity being supplied thereto and including means for alternately connecting said input signal and reference signal to said integrator portion, said improvement comprising:

means for generating a variable reference signal, the magnitude of said variable reference signal being varied in dependence on the magnitude of the analogue input signal, for producing a predetermined non-linear relationship between the analogue and the digital output of the converter.

2. An analogue-to-digital converter according to claim 1 in which said means includes a first means for deriving a first signal from the analogue signal such that the ratio of the magnitude of the first signal to the magnitude of the analogue signal bears one of a plurality of fixed numerical values, one of said values being selected in dependence on the magnitude of the analogue signal, further including a second means which supplies a constant reference signal and a summation unit for summing the first signal with the constant reference signal to provide the said variable reference signal.

3. An analogue-to-digital converter according to claim 2 wherein the means for deriving the said first signal comprises a potential dividing network including a plurality of resistors each in series with a respective one of a corresponding plurality of switches, each of the switches being adapted to connect its corresponding resistor to the network so as to modify the dividing ratio of the latter when the output from the network attains a predetermined level uniquely associated with the said switch.

4. An analogue-to-digital converter according to claim 3 wherein each switch comprises a transistor and wherein the said predetermined level is determined by an appropriate bias voltage applied to the base of the transistor.

5. An analogue-to-digital converter according to claim 1 including means for controlling the polarity of the reference signal in dependence upon the polarity of the analogue input signal.

* * * * *

UNITED STATES PATENT AND TRADEMARK OFFICE
CERTIFICATE OF CORRECTION

PATENT NO. : 3,896,431
DATED : July 22, 1975
INVENTOR(S) : BRIAN ARTHUR LEONARD DICKINSON It is certified that error appears in the above-identified patent and that said Letters Patent are hereby corrected as shown below:

Col. 2, line 39, "Fig 4" should be a new paragraph;

Col. 3, line 29, "not" should be --now--;

Col. 4, line 40, "dsplay" should be --display--;

line 44, "sip" should be --ship--;

line 65, "this" should be --the--;

Col. 7, line 19, "$V_{REF}$ is less than that of $V_i$." should read --$V_{REF}$ is less than that of $V_i$.--;

Signed and Sealed this

*eighteenth* Day of *November 1975*

[SEAL]

*Attest:*

RUTH C. MASON
*Attesting Officer*

C. MARSHALL DANN
*Commissioner of Patents and Trademarks*